United States Patent
Shacter et al.

(10) Patent No.: US 7,233,171 B1
(45) Date of Patent: Jun. 19, 2007

(54) APPARATUS AND METHOD FOR TRANSCONDUCTANCE STAGE WITH HIGH CURRENT RESPONSE TO LARGE SIGNALS

(75) Inventors: Stuart B. Shacter, Tucson, AZ (US); Yinming Chen, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 37 days.

(21) Appl. No.: 11/171,957

(22) Filed: Jun. 29, 2005

(51) Int. Cl.
*G01R 19/00* (2006.01)
*H03F 3/45* (2006.01)

(52) U.S. Cl. .......................................... 327/53; 327/66
(58) Field of Classification Search ................ 327/53, 327/66, 562–563
See application file for complete search history.

(56) References Cited

U.S. PATENT DOCUMENTS

| | | | | |
|---|---|---|---|---|
| 3,921,090 | A * | 11/1975 | Wheatley et al. | 330/257 |
| 4,361,816 | A * | 11/1982 | Schade, Jr. | 330/288 |
| 5,182,525 | A | 1/1993 | Theus | |
| 5,574,401 | A * | 11/1996 | Spitalny | 330/253 |
| 6,611,171 | B2 * | 8/2003 | Kimura | 330/253 |
| 2004/0217806 | A1 * | 11/2004 | Kasperkovitz | 327/552 |

OTHER PUBLICATIONS

Marc G. Degrauwe et al., "Adaptive Biasing CMOS Amplifiers," IEEE Journal of Solid-State Circuits, 1982, vol. SC-17, No. 3, pp. 522-528.
Stanislaw Szczepanski, "VHF Fully-Differential Linearized CMOS Transconductance Element and Its Applications," IEEE International Symposium on Circuits and Systems, ISCAS 1994, vol. 5, pp. 97-100.

* cited by examiner

*Primary Examiner*—My-Trang Nu Ton
(74) *Attorney, Agent, or Firm*—Darby & Darby PC; Matthew M. Gaffney

(57) ABSTRACT

A transconductance stage is provided. The transconductance stage includes a tail current source, a differential pair, and two current mirrors. The input to each of the current mirrors is connected to the drain of a separate one of the transistors in the differential pair. The two current mirrors each have two outputs so that one of the outputs can be used to determine whether the output current exceeds a threshold (e.g. nine-tenths of the tail current). If the source current exceeds the threshold, extra source current is switched in to the output so that output source current is increased. Similarly, if the sink current exceeds the threshold, extra sink current is switched in to the output so that the output sink current is increased. This way, the transconductance stage can supply large output currents in response to a large signal input but maintains low quiescent current for small input signals.

20 Claims, 7 Drawing Sheets

US 7,233,171 B1

APPARATUS AND METHOD FOR TRANSCONDUCTANCE STAGE WITH HIGH CURRENT RESPONSE TO LARGE SIGNALS

FIELD OF THE INVENTION

The invention is related to transconductance circuits, and in particular, to an apparatus and method for a transconductance circuit with a high current response to a large differential input voltage.

BACKGROUND OF THE INVENTION

A typical transconductance stage has an output current that is roughly proportional to its input voltage for some range of input voltage. If the input voltage exceeds the maximum range, the output current of the typical transconductance stage goes to its maximum value. The maximum value is typically set by the tail current of the differential pair. The maximum current typically sets the slew rate of the output under the condition of a large input signal. If a faster slew rate is required, then the tail current typically must be larger, causing a larger quiescent current.

BRIEF DESCRIPTION OF THE DRAWINGS

Non-limiting and non-exhaustive embodiments of the present invention are described with reference to the following drawings, in which.

DETAILED DESCRIPTION

Figure 1:
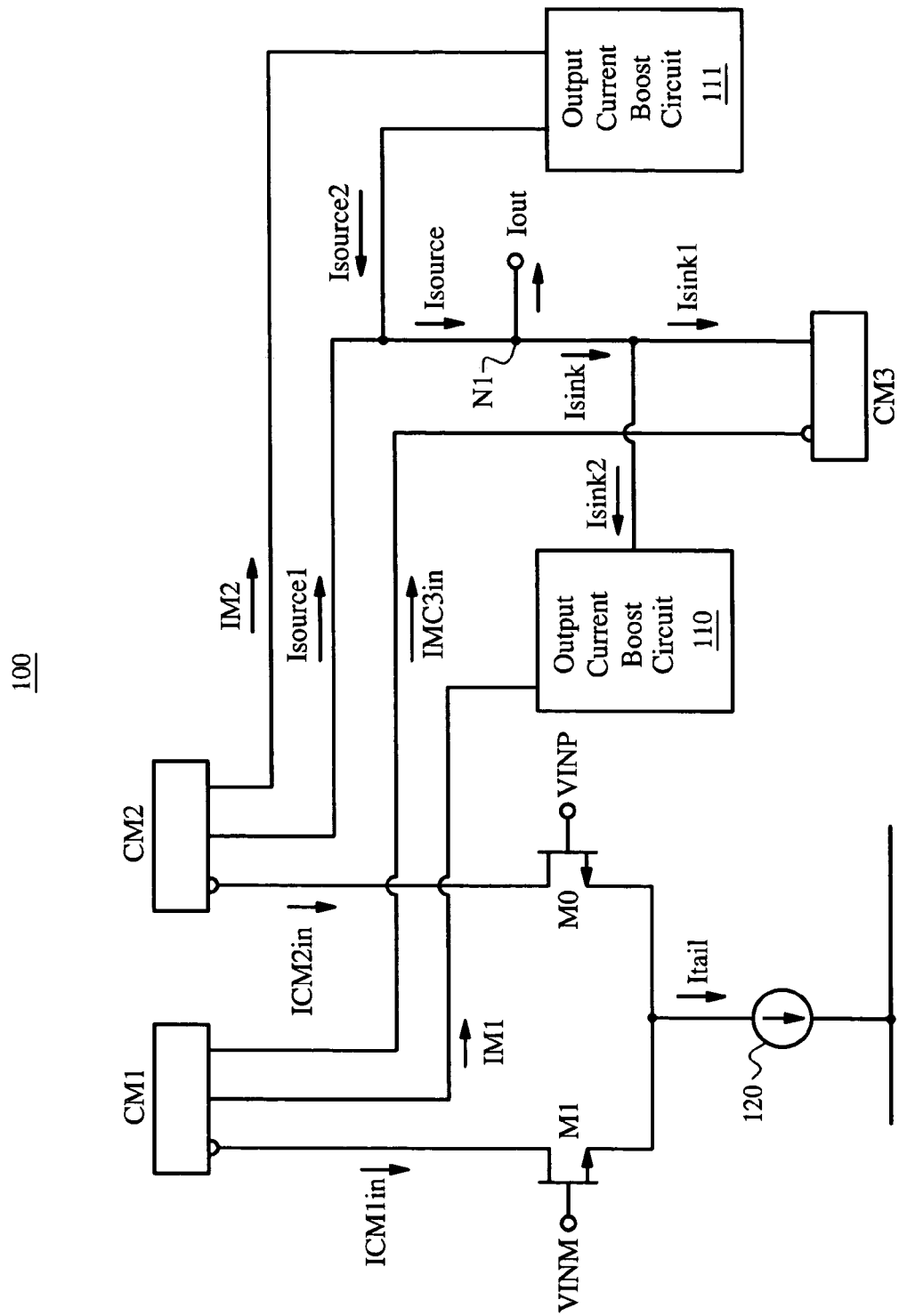
FIG. 1 shows a block diagram of an embodiment of a transconductance circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a transconductance stage that includes a tail current source, a differential pair, and two current mirrors. The input to each of the current mirrors is connected to the drain of a separate one of the transistors in the differential pair. The two current mirrors each have two outputs so that one of the outputs can be used to determine whether the output current exceeds a threshold (e.g. nine-tenths of the tail current). If the source current exceeds the threshold, extra source current is switched in to the output so that output source current is increased. Similarly, if the sink current exceeds the threshold, extra sink current is switched in to the output so that the output sink current is increased. This way, the transconductance stage can supply large output currents in response to a large signal input but maintains low quiescent current for small input signals.

FIG. 1 shows a block diagram of an embodiment of transconductance circuit 100. Transconductance circuit 100 may include transistors M0 and M1, tail current source 120, current mirror circuits CM1–CM3, and output current boost circuits 110 and 111.

In operation, tail current source 120 provides tail current Itail to differential pair M0/M1. Differential pair M0/M1 may be arranged to provide differential current ICM2in–ICM1in such that differential current ICM2in–ICM1in is proportional to differential input voltage VINP-VINM up to a maximum value of Itail.

Further, current mirror circuit CM1 may be arranged to provide mirror current IM1 and third current mirror input current ICM3in responsive to current ICM1in. Similarly, current mirror circuit CM2 may be arranged to provide mirror current IM2 and first source current Isource1 responsive to current ICM2in. Current mirror circuit CM3 may be arranged to provide current Isink1 responsive to current ICM3in.

Additionally, output boost circuit 110 is arranged to operate as follows in one embodiment. In this embodiment, output boost circuit 110 is employed to determine whether current IM1 has reached a sink current threshold. In one embodiment, the sink current threshold is 0.9*Itail. In another embodiment, virtually any current that is relatively close to Itail may be employed as the sink current threshold. Further, output boost circuit 110 is arranged to trip if current IM1 reaches the sink current threshold. If output current boost circuit 110 is not tripped, then output current boost circuit 110 provides substantially no current to output current node N1. However, if output current boost circuit 110 is tripped, then output current boost circuit 110 provides current Isink2 to output current node N1. Output boost circuit 110 enables transconductance circuit 100 to supply a large output sink current in response to large negative differential input signals while maintaining a low quiescent current for small differential input signals.

Similarly, output current boost circuit 111 is arranged to operate as follows in one embodiment. In this embodiment, output current boost circuit 111 is employed determine whether current IM2 has reached a source current threshold.

In one embodiment, the sink and source current thresholds are identical. In other embodiments, the two thresholds may be different. Output current boost circuit 111 is arranged to trip if current IM2 reaches the source current threshold. If output current boost circuit 111 is not tripped, then output current boost circuit 111 provides substantially no current to output current node N1. However, if output current boost circuit 111 is tripped, then output current boost circuit 111 provides current Isource2 to output current node N1. Output current boost circuit 111 enables transconductance circuit 100 to supply a large output source current in response to large positive differential input signals while maintaining a low quiescent current for small differential input signals.

If neither output current boost circuit 110 nor output current boost circuit 111 trips, then total source current Isource may be substantially given by Isource1, and total sink current Isink is substantially given by Isink1. Accordingly, in this case, output current Iout may be substantially given by Isource1−Isink1, which is substantially equal to ICM2in−ICM1in (for an embodiment in which 1:1 current mirrors are employed).

However, in one embodiment, if output current boost circuit 110 trips, output current Iout is a sink current that is substantially given by Isink1+Isink2. Conversely, if output current boost circuit 111 trips, output current Iout may be a source current that may be substantially given by Isource1+Isource2.

Although one embodiment of transconductance circuit 100 is illustrated in FIG. 1 and discussed above for illustrative purposes, many variations to the embodiment discussed above are within the scope and spirit of the invention. For example, in some applications, it may be desirable for transconductance circuit 100 to be capable of providing a large current sink response, but not a large current source response. In such applications, an embodiment of circuit 100 that does not include output current boost circuit 111 may be employed. In this embodiment, current mirror circuit CM2 does not require a second output since current IM2 is not needed.

Figure 2:
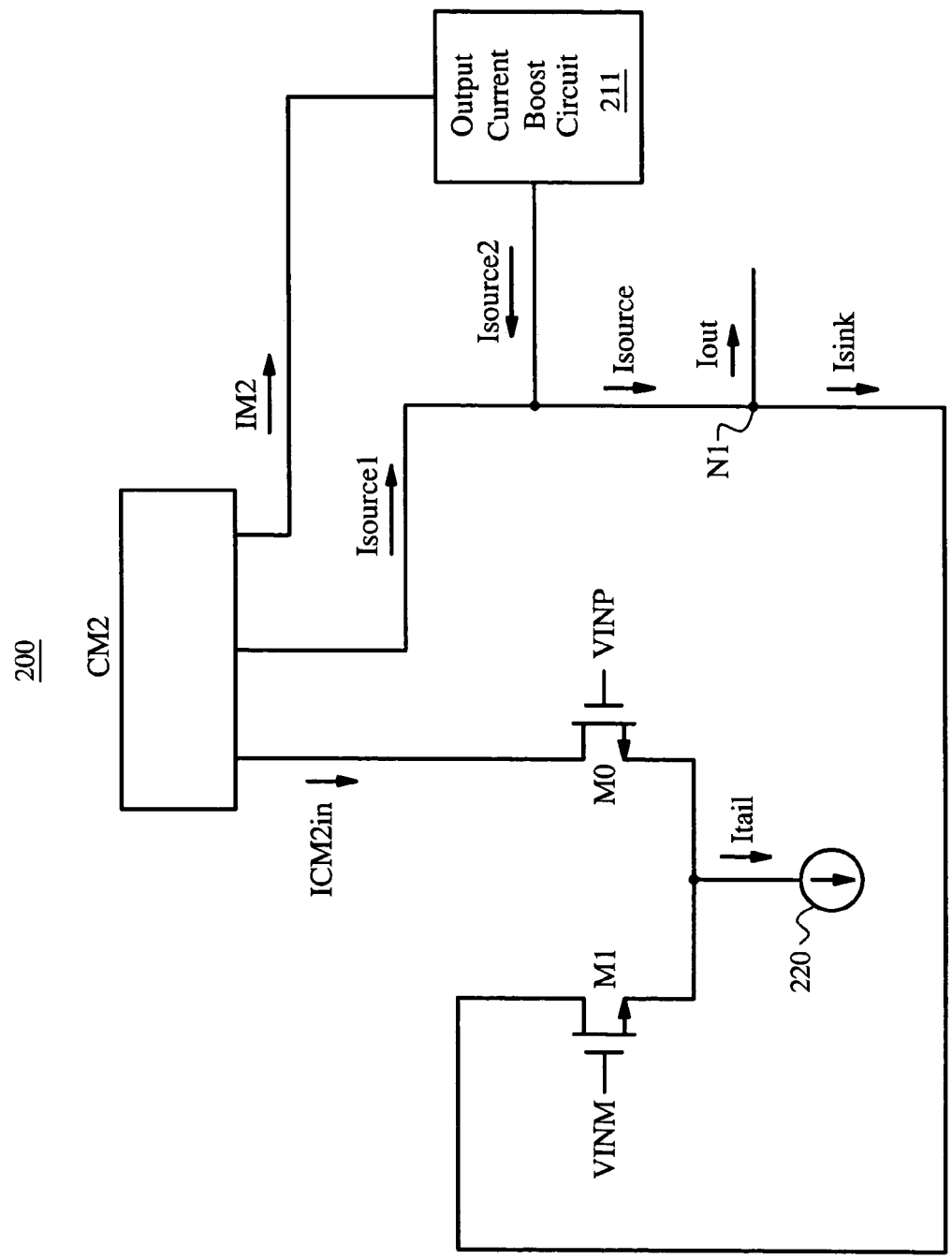
FIG. 2 illustrates a block diagram of another embodiment of the transconductance circuit of FIG. 1.

Conversely, in some applications, it may be desirable for transconductance circuit 100 to be capable of providing a large current source response, but not a large current sink response. In this embodiment, current mirror circuit CM1, current mirror circuit CM3, and output boost circuit 110 may be excluded from circuit 100, as illustrated in FIG. 2 below in one embodiment.

In one embodiment, current mirror circuits CM1–CM3 are each 1:1 current mirrors. In other embodiments, one or more of current mirror circuits CM1–CM3 may have a ratio other than 1:1. In an embodiment in which the current mirror has a ratio other than 1:1, other circuitry may be adjusted accordingly. For example, if current mirror circuit CM1 has a ratio of 1:2, then output current boost circuit 110 may be arranged to determine whether current IM1 has reached 0.45*Itail, thereby determining whether current ICM1in has reached 0.9*Itail.

Although the drain currents of transistors M0 and M1 are shown as going directly to the inputs of current mirror circuits CM2 and CM1 respectively in FIG. 1, in other embodiment, the drains of transistors M0 and M1 may be coupled to the inputs of current mirror circuits CM2 and CM1 respectively through one or more intermediary devices, such as a cascode transistor. Similarly, cascode transistors, source followers, and/or other various active and passive intermediary devices may be further included in one or more of the signals paths for other various parts of transconductance circuit 100 without departing from the scope and spirit of the invention.

Also, although transconductance circuit 100 is shown in FIG. 1 as providing a single-ended current output, in other embodiments, transconductance circuit 100 may be arranged to provide a differential current output. For an embodiment that provides a differential current output in which a large current response is desired for large input signals of either polarity, this would require including circuitry for providing extra source current and extra sink current for both of the output current nodes.

In some embodiments, hysteresis may be employed for the tripping of one or both of output current boost circuit 110 and output current boost circuit 111 to prevent oscillation or chattering. In other embodiments, hysteresis is not employed.

Although transistors M0 and M1 are shown as MOSFETs in FIG. 1, in other embodiments, transistors M0 and M1 may be replaced by another type of a transistor, such as a BJT, and/or the like. Also, the circuit illustrated in FIG. 1 may be "turned upside down", a rail-to-rail implementation may be employed, and/or the like. These variations and others are within the scope and spirit of the invention.

FIG. 2 illustrates a block diagram of an embodiment of transconductance circuit 200. Transconductance circuit 200 includes tail current source 220, transistors M0 and M1, current mirror circuit CM2, and output current boost circuit 211.

Although one embodiment of transconductance circuit 200 is illustrated in FIG. 2, other embodiments are within the scope and spirit of the invention. For example, in other embodiments, additional components not shown in FIG. 2 may be included in transconductance circuit 200. In one embodiment, transconductance circuit 200 further includes another current mirror to provide current Isink from the drain current of transistor M1.

Figure 3:
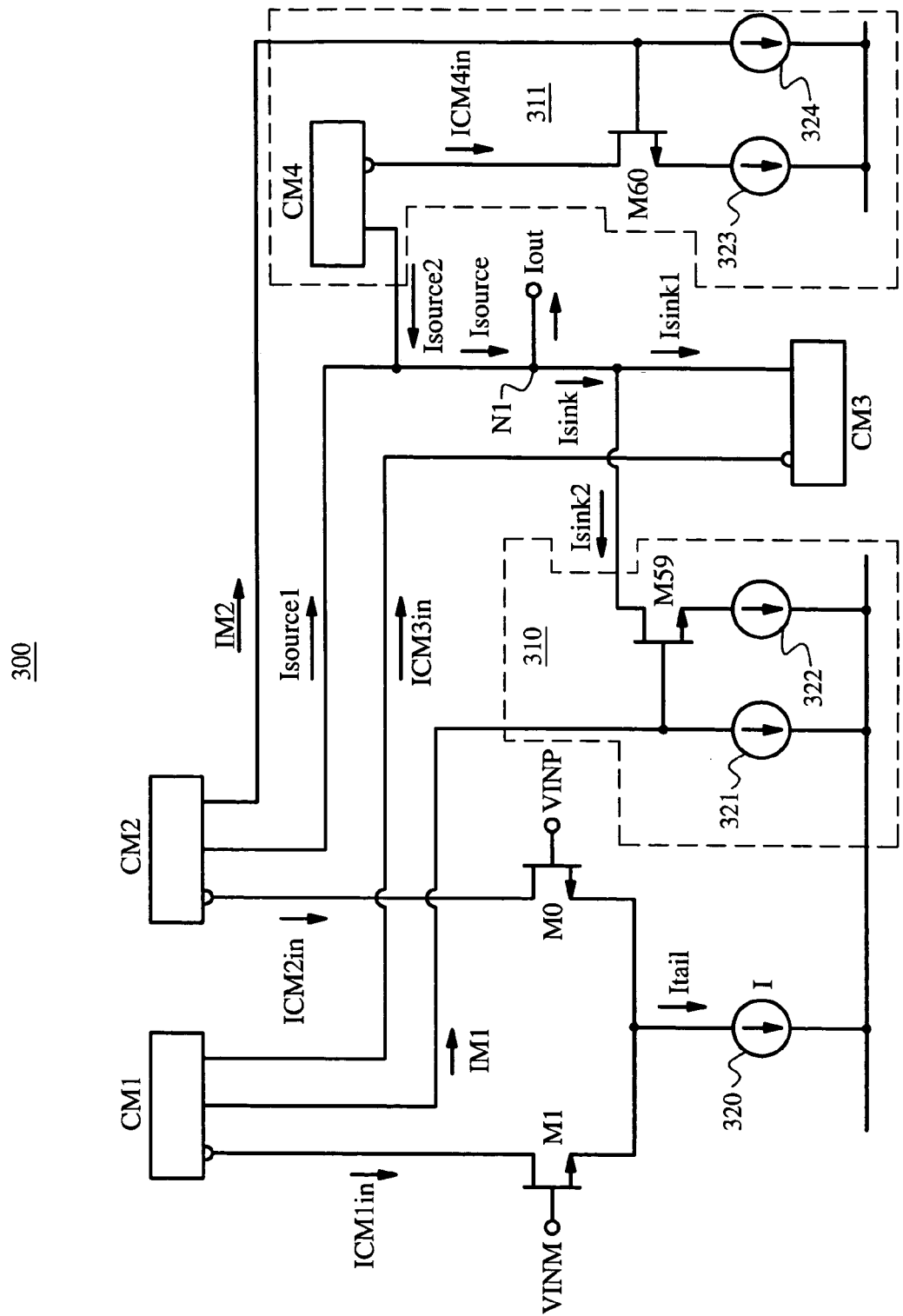
FIG. 3 shows a block diagram of yet another embodiment of the transconductance circuit of FIG. 1.

FIG. 3 shows a block diagram of transconductance circuit 300, which may be employed as an embodiment of transconductance circuit 100. Output current boost circuit 310 includes current source circuit 321, current source circuit 322, and transistor M59. Output current boost circuit 311 includes current source circuit 323, current source circuit 324, transistor M60, and current mirror circuit CM4.

Transistors M59 and M60 are each configured to operate as a switch circuit. Current source circuit 324 is arranged to operate as a current source that provides a current equal to the source threshold if current source circuit 324 is operating in saturation mode. If current ICM2in reaches the source threshold, then current source circuit 324 operates in saturation mode, and the transistor in the branch of current mirror circuit CM2 that provides current IM2 operates in triode. When the transistor in the branch of current mirror CM2 that provides current IM2 operates in triode, it pulls up the gate of transistor M60 up such that transistor M60 is tripped (e.g. operates in conducting mode). If current ICM2 has not reached the source threshold, current source circuit 324 operates in triode. When current source circuit 324 operates in triode, it acts as a pull-down device, causing transistor M60 operate in cutoff mode (i.e. not tripped).

When transistor M60 is tripped, current source circuit 323 provides fourth current mirror input current ICM4in to current mirror circuit CM4, which in turn provides current Isource2. However, when transistor M60 is not tripped, currents ICM4in and Isource2 are substantially zero.

In one embodiment, current Itail is a relatively constant current of about 30 µA, and currents Isink2 and Isource2 are each about 450 µA when the corresponding switch is tripped.

However, the invention is not so limited, and a variety of current values may be employed without departing from the scope and spirit of the invention. In a preferred embodiment, the additional sink or source current employed when the sink or source threshold is reached is significantly larger than the tail current.

Although one embodiment of output current boost circuit 311 is illustrated in FIG. 3 and described above for illustrative purposes, other embodiments are within the scope and spirit of the invention. For example, in another embodiment, output current boost circuit 311 may include a current comparator circuit, with the output of the current comparator circuit coupled to the gate of transistor M60, one input coupled to current source 324, and the other input coupled to current IM2. A similar embodiment may be employed for output current boost circuit 310.

In one embodiment, transconductance circuit 300 is arranged in a buffer configuration with node N1 coupled to the inverting input at the gate of transistor M1. In another embodiment, a buffer configuration is not employed.

In some embodiments, hysteresis is not employed, and in other embodiments, hysteresis is added to the gate drive of transistors M59 and M60 to enhance the stability of transconductance circuit 300 at the transition point. In embodiments in which hysteresis is employed, the hysteresis may be accomplished in a number of different ways. In one embodiment, a Schmidt buffer (not shown) drives the gates of the switches. In another embodiment, the value of the current provided by current sources 321 and 324 may be modulated based on the state of the corresponding switch.

Figure 4A:
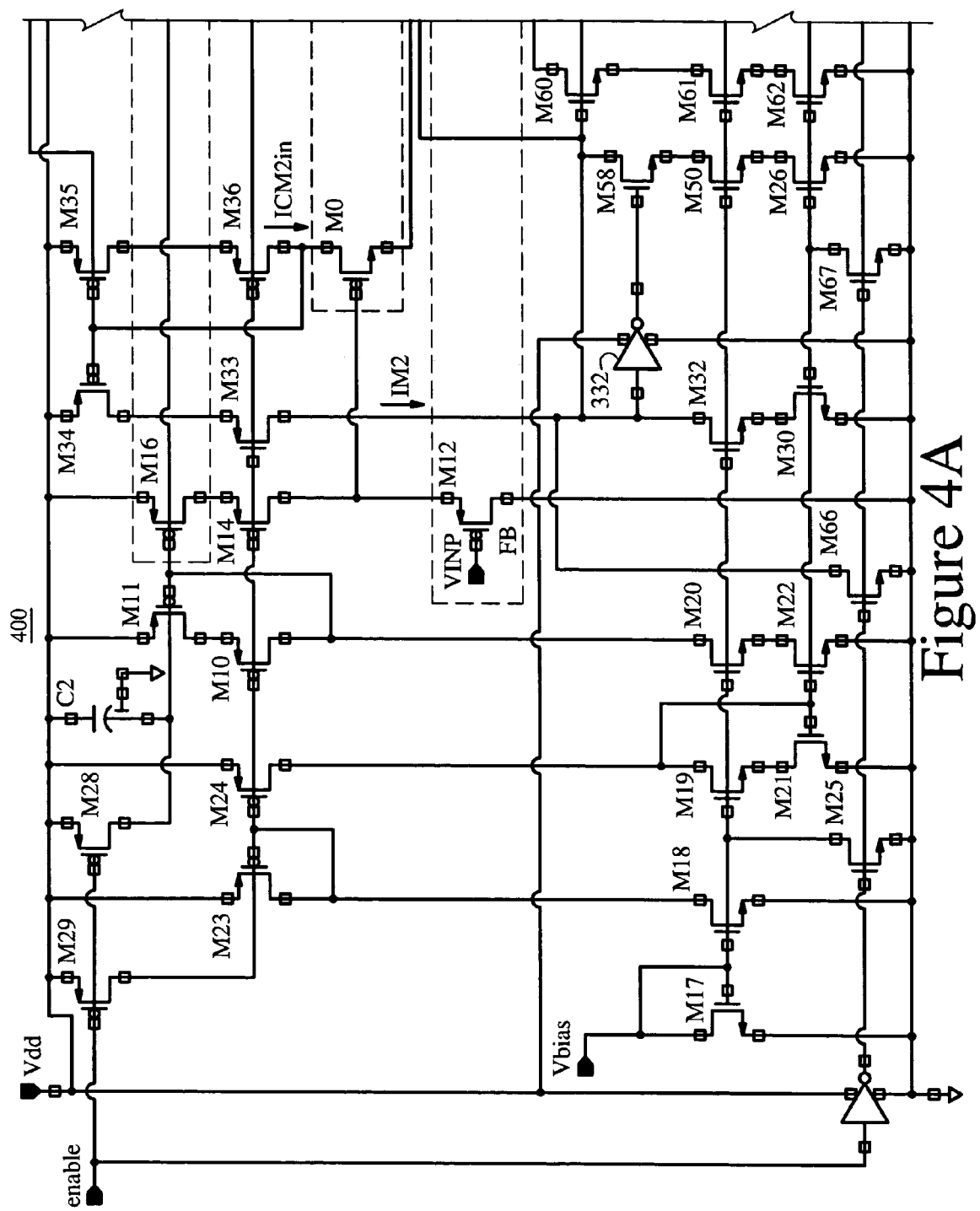
FIGS. 4A and 4B schematically illustrate an embodiment of the transconductance circuit of FIG. 3.
Figure 4B:
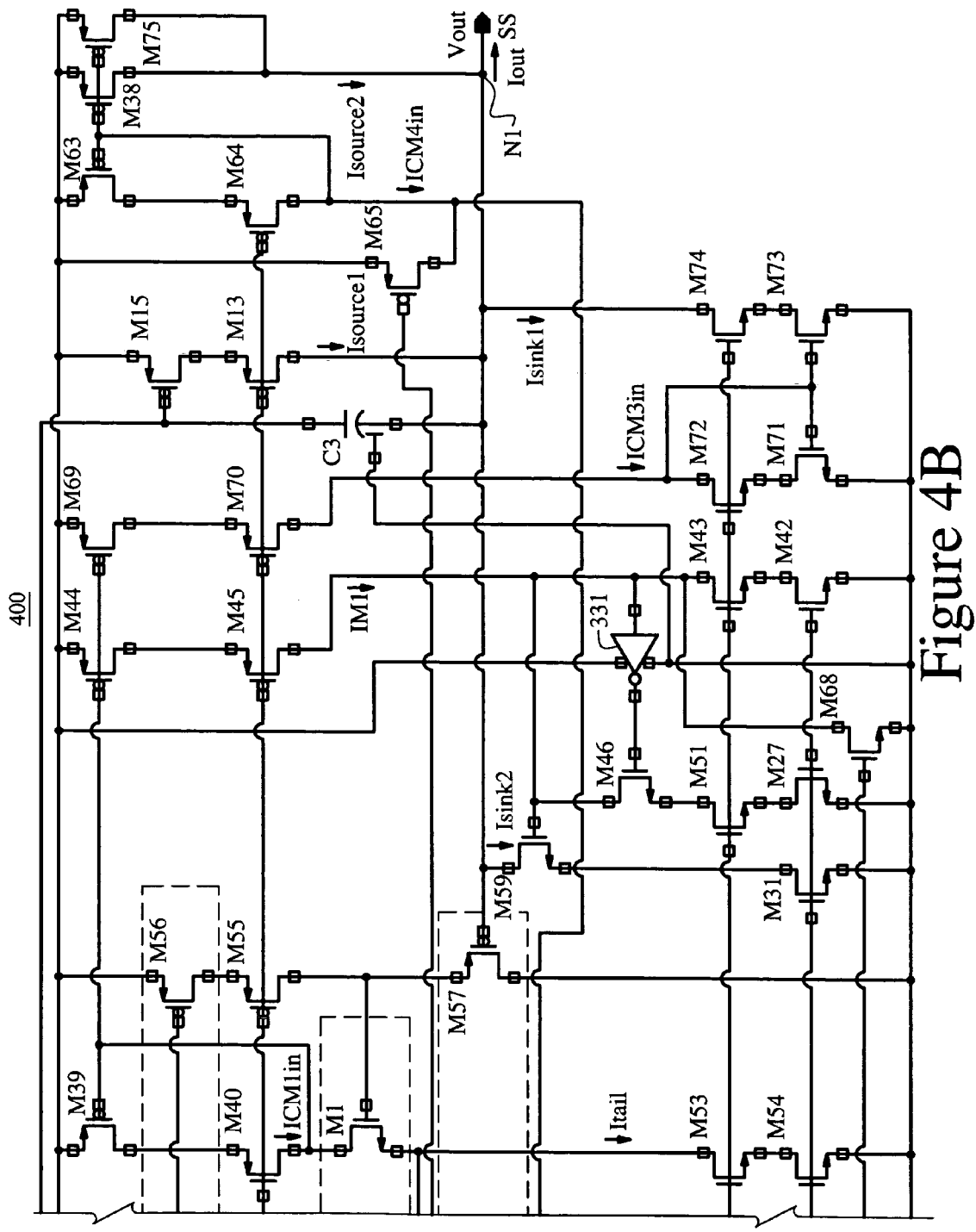

FIGS. 4A and 4B schematically illustrate an embodiment of transconductance circuit 400, which may be employed as an embodiment of transconductance circuit 300 of FIG. 3.

Transistors M12 and M57 operate as source followers which receive the differential input signal before it is provided to differential pair M0/M1. Transconductance circuit 400 is arranged in a buffer configuration with output current node N1 coupled to the gate of transistor M57.

Transistor M54 is arranged to operate as an embodiment of tail current source 320 of FIG. 3. Transistors M13, M15, and M33–M36 are arranged to operate as an embodiment of current mirror circuit CM2 of FIG. 3. Also, transistors M39, M40, M44, M45, M69, and M70 are arranged to operate as an embodiment of current mirror circuit CM1 of FIG. 3. Transistors M71–M74 are arranged to operate as an embodiment of current mirror circuit CM3 of FIG. 3. Transistors M63, M64, M38, and M75 are arranged to operate as an embodiment of current mirror circuit CM4 of FIG. 3.

Additionally, transistor M30 is arranged to operate as an embodiment of current source circuit 324 of FIG. 3. Transistor M62 is arranged to operate as an embodiment of current source circuit 323 of FIG. 3. Also, transistor M42 is arranged to operate as an embodiment of transistor 321 of FIG. 3. Transistor M31 is arranged to operate as an embodiment of current source circuit 322 of FIG. 3.

Further, transconductance circuit 400 includes hysteresis circuitry. Inverter 331, transistor M46, transistor M51, and transistor M27 operate as a first hysteresis circuit; and inverter 332, transistor M58, transistor M50, and transistor M26 operate as a second hysteresis circuit. Transistors M46 is arranged to operate as a switch circuit controlled based on the voltage at the output of inverter 331, and transistor M58 is arranged to operate as a switch circuit controlled based on the voltage at the output of inverter 332. Also, transistors M27 and M26 operate as current source circuits that sink current from the gate of transistors M59 and M60 respectively if the corresponding switch transistor (M46 and M58 respectively) is conducting.

Figure 5:
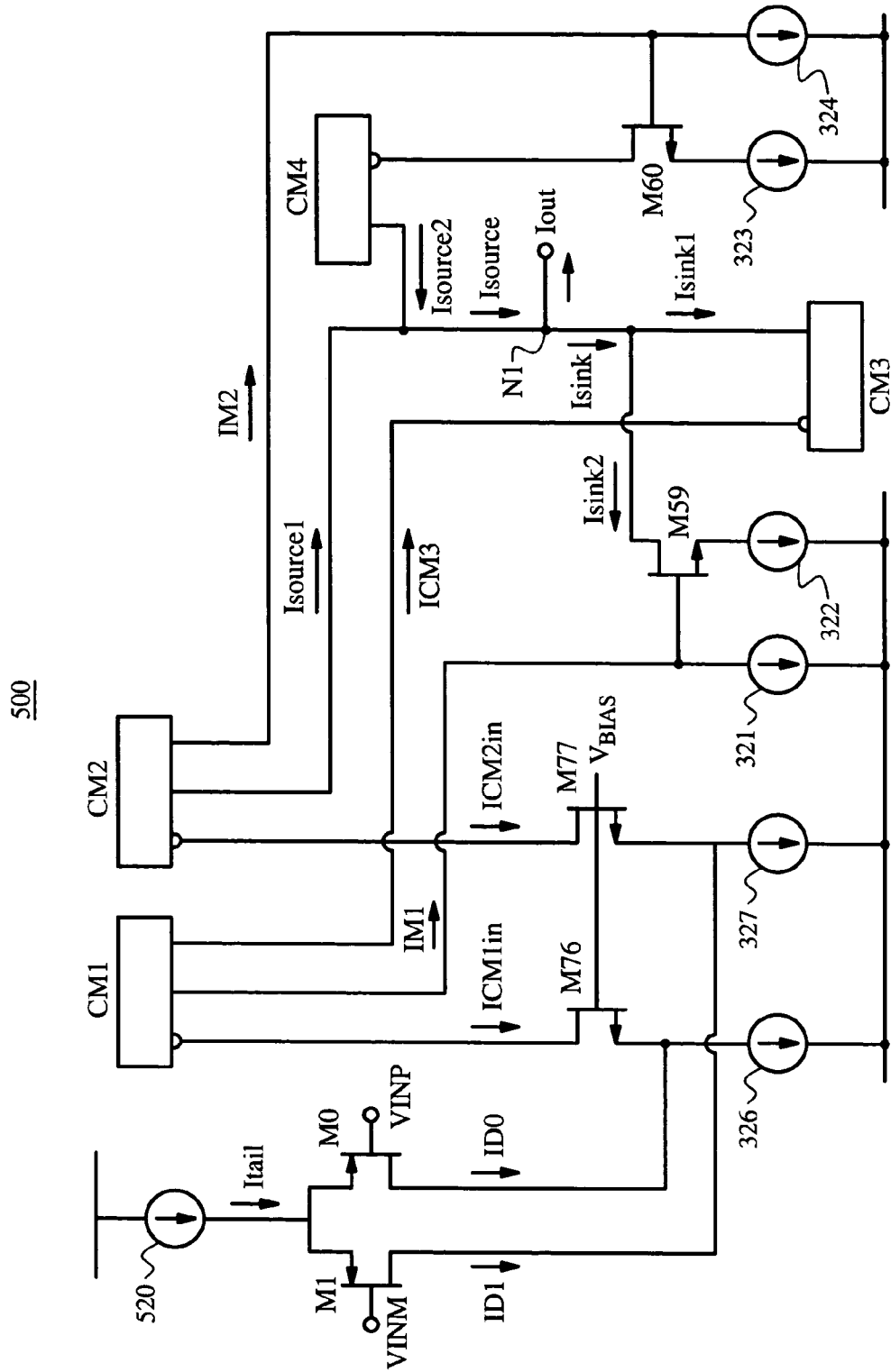
FIG. 5 shows a block diagram of an embodiment of the transconductance circuit of FIG. 3 that includes a folded cascode architecture.

FIG. 5 shows a block diagram of an embodiment of transconductance circuit 500, which may be employed as an embodiment of transconductance circuit 300 of FIG. 3. Transconductance circuit 500 includes a folded cascode architecture. Transconductance circuit 500 further includes folded cascode bias current source circuit 326, folded cascode bias current source 327, cascode transistor M76, and cascode transistor M77.

In operation, differential pair M0/M1 provides differential current ID0–ID1. Cascode transistor M76 is arranged to provide current ICM1in responsive to current ID0, and cascode transistor M77 is arranged to provide current ICM2in responsive to current ID1.

Figure 6:
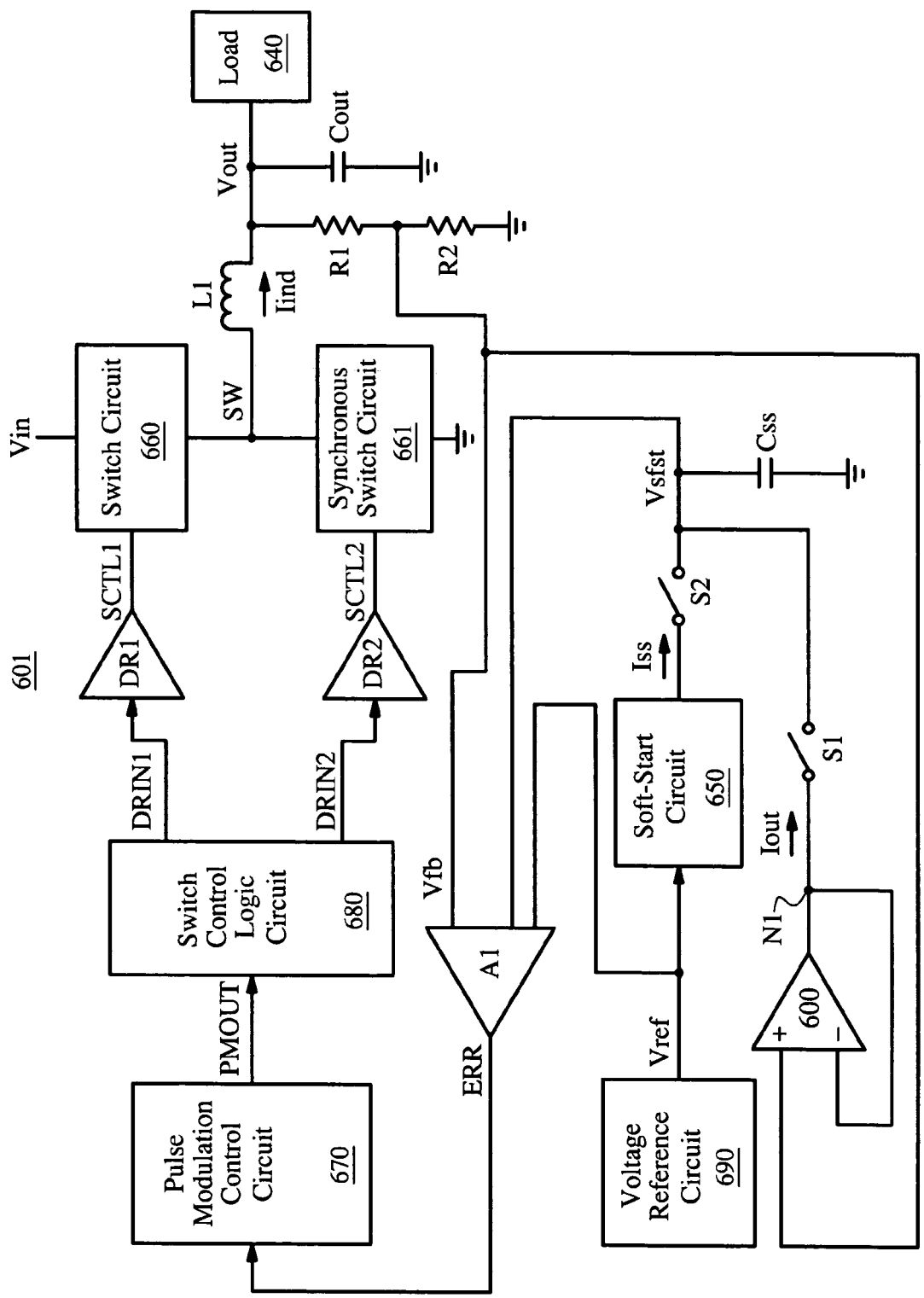
FIG. 6 illustrates a block diagram of an embodiment of a switching regulator circuit that includes an embodiment of the transconductance circuit of FIG. 1, arranged in accordance with aspects of the present invention.

FIG. 6 illustrates a block diagram of an embodiment of a switching regulator circuit 601. Switching regulator circuit 601 includes transconductance circuit 600, which is an embodiment of transconductance circuit 100 of FIG. 1. Switching regulator circuit 601 further includes switch circuit 660, synchronous switch circuit 661, inductor L1, pulse modulation control circuit 670, switch control logic circuit 680, output capacitor Cout, load 640, error amplifier A1, voltage reference circuit 690, soft-start circuit 650, soft-start capacitor $C_{SS}$, and resistors R1 and R2. Additionally, although not shown in FIG. 6, other elements such as a capacitor resistor network may be included between error signal ERR and feedback signal Vfb to control the frequency response of switching regulator circuit 601.

In one embodiment, switching regulator circuit 601 is arranged to provide regulated output voltage Vout from input voltage Vin. Switch circuit 660 is arranged to open and close based on switch control signal SCTL1. Similarly, in a synchronously-rectified embodiment, synchronous switch circuit 661 is arranged to open and close based on synchronous switch control signal SCTL2. Inductor L1 may be arranged to provide inductor current Iind to output capacitor Cout such that output voltage Vout is provided.

Voltage reference circuit 690 is arranged to provide voltage Vref. In one embodiment, resistors R1 and R2 are arranged as a voltage divider to provide feedback signal Vfb from output voltage Vout. Also, error amplifier A1 is arranged to provide error signal ERR from signals Vfb and Vref when soft-start voltage Vsfst reaches voltage Vref. However, if voltage Vsfst is less than voltage Vref, error amplifier A1 provides signal ERR from signals Vfb and Vsfst. In one embodiment, error amplifier A1 is arranged to provide signal ERR as a voltage, $V_{ERR}$. In another embodiment, error amplifier A1 is an operational transconductance amplifier (OTA) that is arranged to provide error signal ERR as a current, $I_{ERR}$.

Pulse modulation circuit 670 is arranged to provide pulse modulation output signal PMOUT based on signal ERR. Switch control logic circuit 680 is arranged to provide signal DRIN1 from signal PMOUT. Also, in a synchronously-rectified embodiment, switch control logic circuit 680 is further arranged to provide signal DRIN2 from signal PMOUT. Driver circuit DR1 is arranged to provide switch control signal SCTL1 from signal DRIN1. In a synchronously-rectified embodiment, switching regulator circuit 601 includes driver circuit DR2, which is arranged to provide switch control signal SCTL2 from signal DRIN2.

When switching regulator circuit 601 is enabled, initially, switch S1 is closed and switch S2 is open. Accordingly, if voltage Vsfst is not close to feedback voltage Vfb, then transconductance circuit 600 provides a large current response to charge or discharge soft-start capacitor $C_{SS}$ such that voltage Vsfst reaches voltage Vfb relatively quickly. This may be particularly useful for brief shutdown periods. The time in which switch S1 is closed is an initialization period in which no regulation occurs. In one embodiment, the initialization period is on the order of tens of microseconds. After this initialization period, switch S1 is opened and switch S2 is closed. Accordingly, voltage Vout is soft-started to the desired regulated output voltage.

Although switching regulator circuit 601 illustrates one application for an embodiment of transconductance circuit 600 of FIG. 6, as previously discussed, the invention is not so limited, and embodiments of transconductance circuit 600 may be used for other applications.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for providing a current response, comprising:
  a transconductance circuit that is arranged to provide an output current based at least in part on a differential input voltage, wherein the transconductance circuit is arranged to provide the output current at an output current node, and wherein the transconductance circuit includes:
    a differential pair including a first transistor and a second transistor;
    a tail current source that is coupled to the differential pair;
    a first current mirror circuit having at least an input, a first output, and a second output, wherein the input of the first current mirror circuit is coupled to the first transistor, the first output of the current mirror circuit is coupled to an output current node; and wherein the first current mirror circuit is arranged to provide a first mirror current at the second output of the first current mirror circuit; and
    a first output current boost circuit that is coupled to the second output of the first current mirror, wherein the first output current boost circuit is arranged to trip if the first mirror current reaches a threshold, and further arranged to increase the output current if the output current boost circuit is tripped.

2. The circuit of claim 1, further comprising:
  a soft-start circuit;
  a plurality of switches that is arranged to:
    when the circuit for providing the current response is first enabled, couple the output current node to a soft-start capacitor node until a soft-start voltage at the soft-start capacitor node is substantially equal to a feedback voltage; and
    when the soft-start capacitor voltage is substantially equal to the feedback voltage, couple the soft-start circuit to the soft-start capacitor node; and
  an error amplifier including a first input that is coupled to the soft-start capacitor node, and a second input that is arranged to receive the feedback voltage, wherein the transconductance circuit includes a first input and a second input, and wherein the first input of the transconductance circuit is coupled to the output current node.

3. The circuit of claim 1, wherein the tail current source is configured to provide a tail current that is relatively independent of the differential input voltage.

4. The circuit of claim 1, wherein the tail current source is configured to provide a tail current, and wherein the threshold is about nine-tenths of the tail current.

5. The circuit of claim 1, wherein
  the first output current boost circuit includes:
    a first current source circuit; and
    a first switch circuit that is configured to trip if the first mirror current reaches the threshold, wherein the first switch circuit is arranged to couple the first current source circuit to the output node if the first switch circuit is tripped, and further arranged to isolate the first current source circuit from the output current node if the first switch circuit is not tripped.

6. The circuit of claim 5, wherein the first output current boost circuit further includes a hysteresis circuit that is coupled to the first switch circuit.

7. The circuit of claim 1, wherein
  the first output current boost circuit is arranged to provide a source current to the output current node to increase the output current if the output current boost circuit is tripped;
  the transconductance circuit further includes:
    a second current mirror circuit having at least an input, a first output, and a second output, wherein the input of the second current mirror circuit is coupled to the second transistor; the first output of the current mirror circuit is coupled to the output current node; and wherein the second current mirror circuit is arranged to provide a second mirror current at the second output of the second current mirror circuit; and
    a second output current boost circuit that is coupled to the second output of the second current mirror, wherein the second output current boost circuit is arranged to trip if the second mirror current reaches a second threshold, and further arranged to provide a sink current to the output current node if the output current boost circuit is tripped; and
  wherein the first output current boost circuit includes:
    a first switch circuit that is arranged to trip if the first mirror current reaches the threshold;
    a first current source circuit that is arranged to provide a first current source current if the first switch circuit is closed; and
    a third current mirror circuit including an input that is arranged to receive the first current source current and an output that is coupled to the output current node.

8. The circuit of claim 7, wherein the first output current boost circuit further includes:
  a third transistor that is arranged to operate as a current source if the first mirror current reaches the threshold, and to operate as a pull-down or pull-up device if the first mirror current is less than the threshold, wherein the third transistor is arranged such that the first switch circuit trips if the third transistor operates as a pull-down or pull-up device.

9. The circuit of claim 7, wherein
  the second output current boost circuit includes:
    a second switch circuit that is arranged to trip if the second mirror current reaches the second threshold; and
    a second current source circuit that is arranged to provide a second current source current to the output node if the second switch circuit is closed.

10. A transconductance circuit that is arranged to provide an output current at an output node, comprising:

a differential pair including: a first transistor having at least a drain, and a second transistor having at least a drain;

a tail current source that is coupled to the differential pair;

a first current mirror circuit having at least an input, a first output, and a second output, wherein the input of the first current mirror circuit is coupled to the drain of the first transistor; and wherein the first current mirror circuit is arranged to provide a first mirror current at the second output of the first current mirror circuit;

a second current mirror circuit having at least an input, a first output, and a second output, wherein the input of the second current mirror circuit is coupled to the drain of the second transistor; the second current mirror circuit is arranged to provide a first drain current at the first output of the second current mirror circuit; the first output of the second current mirror circuit is coupled to the output node; and wherein the first current mirror circuit is arranged to provide a second mirror current at the second output of the second current mirror circuit;

a third current mirror circuit having at least an input and an output, wherein the input of the third current mirror circuit is coupled to the first output of the first current mirror circuit, the output of the third current mirror circuit is coupled to the output node; and wherein the third current mirror circuit is arranged to provide a first sink current at the output of the third current mirror circuit;

a first switch circuit that is arranged to trip if the first mirror current reaches a sink threshold;

a first current source circuit that is arranged to provide a second sink current if the first switch circuit is tripped, wherein the first switch circuit is coupled between the first current source circuit and the output node such that, if the first switch circuit is tripped, a total sink current at the output node is substantially given by the first sink circuit plus the second sink circuit;

a second switch circuit that is arranged to trip if the second mirror current reaches a source threshold;

a fourth current mirror circuit having at least an input and an output, wherein the output of the fourth current mirror circuit is coupled to the output node, and wherein the fourth current mirror circuit is configured to provide a second source current at the output of the fourth current mirror circuit; and a second current source circuit that is arranged to provide a second current source current if the second switch circuit is tripped, wherein the second switch circuit is coupled between the second current source circuit and the output node such that, if the second switch circuit is tripped, a total source current at the output node is substantially given by the first source current plus the second source current.

11. The circuit of claim 10, wherein the transconductance circuit is arranged to operate such that:

if the first switch circuit is not tripped, then the second sink current is approximately zero;

if the second switch circuit is not tripped, then second source current is approximately zero;

if the first and second switch circuits are both not tripped, then a total output current provided by the transconductance circuit at the output node is approximately equal to the first source current minus the first sink current, and the total output current is approximately proportional to a differential input voltage received by the transconductance circuit;

if the first switch circuit is tripped, the total output current is a sink current that is approximately equal to the first sink current plus the second sink current, wherein the second sink current is at least ten times the second source current; and if the second switch circuit is tripped, the total output current is a source current that is approximately equal to the first source current plus the second source current, wherein the second source current is at least ten times the first source current.

12. The transconductance circuit of claim 10, further comprising:

a third transistor, wherein the first switch circuit has at least a control input that is coupled to the second output of the first current mirror circuit; the third transistor is coupled between the control input of the first switch circuit and ground; and wherein the third transistor is arranged to operate as a current source if the first mirror current reaches the sink threshold, and to operate as a pull-down device if the first mirror current is less than the sink threshold such that, if the first mirror current reaches the sink threshold, the third transistor pulls the control input of the first switch circuit substantially to ground, tripping the first switch circuit; and a fourth transistor, wherein the second switch circuit has at least a control input that is coupled to the second output of the second current mirror circuit; the fourth transistor is coupled between the control input of the second switch circuit and ground; and wherein the fourth transistor is arranged to operate as a current source if the mirror current reaches the source threshold, and to operate as a pull-down device if the mirror current is less than the source threshold such that, if the mirror current reaches the source threshold, the fourth transistor pulls the control input of the second switch circuit substantially to ground, tripping the second switch circuit.

13. The transconductance circuit of claim 10, further comprising:

a first current comparator circuit, wherein the first switch circuit has at least a control input; and wherein the first current comparator circuit has at least: a first input that is coupled to the second output of the first current mirror circuit, and an output that is coupled to the control input of the first switch circuit; and a second current comparator circuit, wherein the second switch circuit has at least a control input; and wherein the second current comparator circuit has at least: a first input that is coupled to the second output of the second current mirror circuit, and an output that is coupled to the control input of the second switch circuit.

14. The transconductance circuit of claim 10, further comprising:

a first folded cascode bias current source circuit that is coupled to the drain of the first transistor;

a first cascode transistor that is coupled between the drain of the first transistor and the input of the first current mirror circuit;

a second folded cascode bias current source circuit that is coupled to the drain of the second transistor; and a second cascode transistor that is coupled between the drain of the second transistor and the input of the second current mirror circuit.

15. The transconductance circuit of claim 10, further comprising:

a first source follower that is arranged to receive a first half of a differential input signal, wherein the first transistor further has at least a gate, and wherein the first source follower has at least an output that is coupled to gate of the first transistor; and a second source follower that is arranged to receive a second half of the differential input signal, wherein the second transistor further has at least a gate, and wherein the second source follower has at least an output that is coupled to gate of the second transistor.

16. The transconductance circuit of claim 10, further comprising:

a first hysteresis circuit, including:
  a first inverter, wherein the first and second switch circuits each have at least a control input, and wherein the first inverter has at least: an input that is coupled to the control input of the first switch circuit, and an output;
  a first hysteresis current source circuit; and
  a third switch circuit that is coupled between the first hysteresis circuit and the control input of the first switch circuit, where the third switch circuit further has at least a control input that is coupled to the output of the first inverter; and a second hysteresis circuit, including:
  a second inverter including at least: an input that is coupled to the control input of the second switch circuit, and an output;
  a second hysteresis current source circuit; and
  a fourth switch circuit that is coupled between the second hysteresis circuit and the control input of the second switch circuit, where the fourth switch circuit further has at least a control input that is coupled to the output of the second inverter.

17. A method for providing a current response, comprising:

providing a tail current to a differential pair, wherein the differential pair includes a first transistor and a second transistor;

providing a first sink current to an output current node based, at least in part, on a drain current of the first transistor;

providing a first source current to the output current node based, at least in part, on a drain current of the second transistor;

determining whether at least one of the first sink current or the first source current exceeds a threshold; and if the at least one of the first sink current or the first source current exceeds the threshold, switching in an additional current to the output current node increase the magnitude of output current provided at the current output node.

18. The method of claim 17, wherein determining whether the at least one of the first sink current or the first source current exceeds the threshold includes determining whether the source current exceeds the threshold; and wherein determining whether the source current exceeds the threshold includes:
  employing a current mirror circuit having at least two outputs to receive the drain current of the second transistor, wherein the first output of the current mirror circuit is employed to provide the first source current, and wherein the second output of the current mirror circuit is employed to provide a mirror current; and
  determining whether the mirror current exceeds the threshold.

19. The circuit of claim 18, wherein determining whether the mirror current exceeds the threshold employs hysteresis.

20. The method of claim 18, wherein determining whether the at least one of the first sink current or the first source circuit exceeds the threshold further includes determining whether the sink current exceeds the threshold, and wherein determining whether the sink current exceeds the threshold includes:

employing another current mirror circuit having at least two outputs to receive the drain current of the first transistor, wherein the first output of the other current mirror circuit is employed to provide the first sink current, and wherein the second output of the other current mirror circuit is employed to provide another mirror current; and determining whether the other mirror current exceeds the threshold.

* * * * *